United States Patent [19]

Hornak et al.

[11] Patent Number: 5,542,424
[45] Date of Patent: Aug. 6, 1996

[54] RESONATOR FOR MAGNETIC RESONANCE IMAGING

[75] Inventors: Joseph P. Hornak, West Henrietta; Scott D. Szeglowski, Lake View, both of N.Y.

[73] Assignee: Rochester Institute of Technology, Rochester, N.Y.

[21] Appl. No.: 287,946

[22] Filed: Aug. 9, 1994

Related U.S. Application Data

[63] Continuation-in-part of Ser. No. 36,899, Mar. 25, 1993, abandoned.

[51] Int. Cl.⁶ .................................................. A61B 5/055
[52] U.S. Cl. ......................................... 128/653.5; 324/318
[58] Field of Search .............................. 128/653.2, 653.5; 324/309, 318, 322

[56] References Cited

U.S. PATENT DOCUMENTS

| | | |
|---|---|---|
| 2,656,483 | 10/1953 | Apstein . |
| 4,446,429 | 5/1984 | Froncisz . |
| 4,480,239 | 10/1984 | Hyde et al. . |
| 4,504,788 | 3/1985 | Froncisz . |
| 4,534,358 | 8/1985 | Young . |
| 4,543,959 | 10/1985 | Sepponen . |
| 4,590,947 | 5/1986 | Krause . |
| 4,720,680 | 1/1988 | Nishihara et al. . |
| 4,724,389 | 2/1988 | Hyde et al. . |
| 4,728,894 | 3/1988 | Yoda et al. . |
| 4,734,647 | 3/1988 | Yoshimura . |
| 4,740,751 | 4/1988 | Misic et al. . |
| 4,791,372 | 12/1988 | Kirk et al. . |
| 4,897,604 | 1/1990 | Carlson et al. . |
| 5,139,024 | 8/1992 | Bryant et al. . |
| 5,143,068 | 9/1992 | Muennemann et al. . |
| 5,185,577 | 2/1993 | Minemura . |

FOREIGN PATENT DOCUMENTS

| | | |
|---|---|---|
| 0135326 | 3/1985 | European Pat. Off. . |
| 0142760 | 5/1985 | European Pat. Off. . |
| 0160942 | 11/1985 | European Pat. Off. . |

OTHER PUBLICATIONS

J. P. Hornak et al., *Journal of Magnetic Resonance*, 68, 319–322 (1986).
J. N. Kneeland, et al. *Radiology*, 1986; 160: 695–699.
J. B. Kneeland, et al. *Radiology*, 1986; 158: 247–250.
W. N. Hardy, et al., *Rev. Sci. Instrum.*, 52(2), Feb. 1981, pp. 213–216.

*Primary Examiner*—Ruth S. Smith
*Attorney, Agent, or Firm*—Nixon, Hargrave, Devans & Doyle

[57] ABSTRACT

A single turn, asymmetric solenoidal coil for imaging the hand and wrist of a human subject. The asymmetric shape of the coil allows for uniform RF field energy to be distributed along the hand and wrist of the subject. The shape of the coil is maintained by a hollow, elongated member of dielectric material. A complementary pair of foils are attached to the outer surface of the hollow, dielectric member. The foils are separated by axial gaps and electrically coupled to each other by capacitors disposed along the length of each gap.

13 Claims, 5 Drawing Sheets

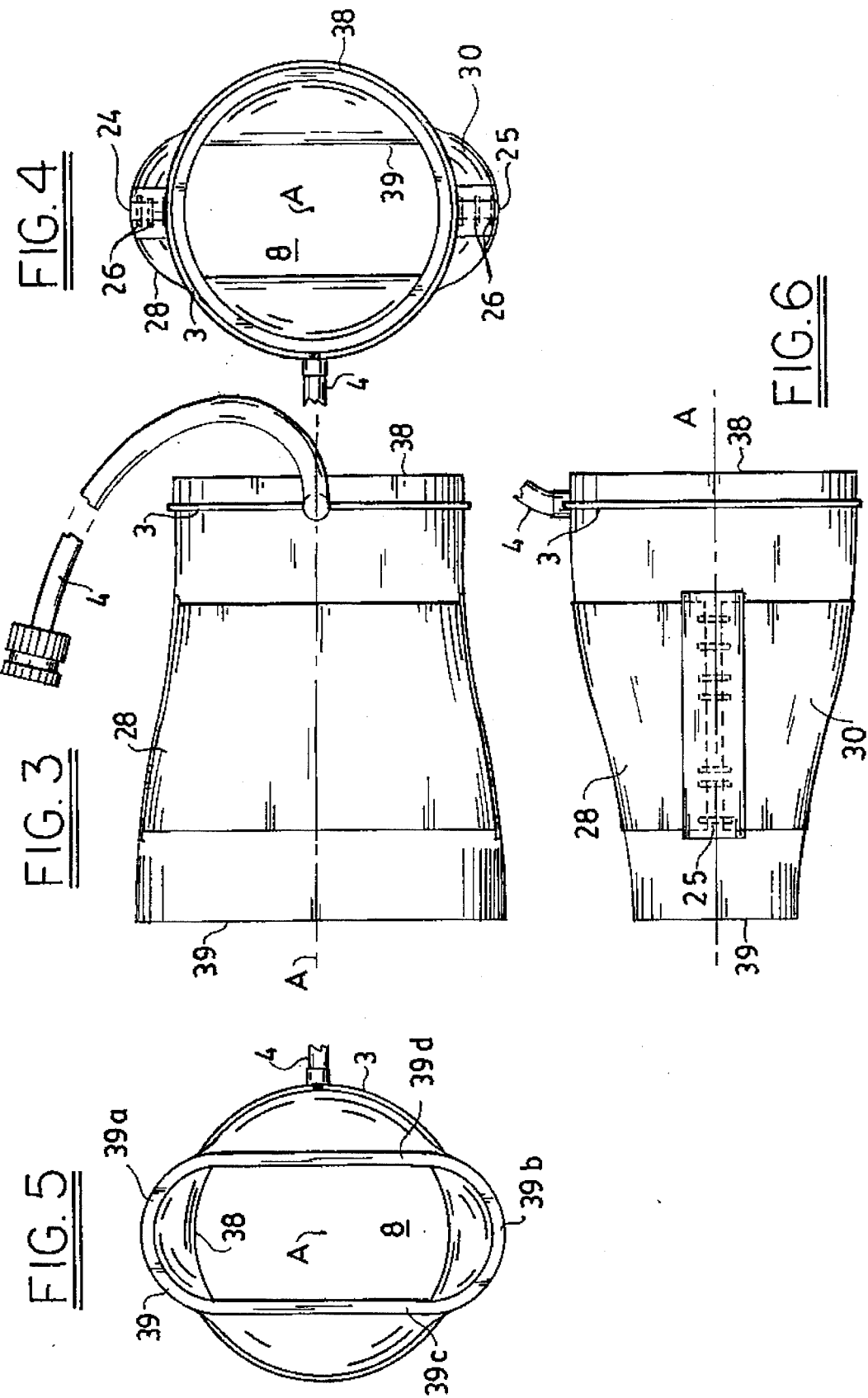

RESONATOR FOR MAGNETIC RESONANCE IMAGING

The present invention relates to magnetic resonance imaging, and more particularly, to a resonator useful when imaging the hand and wrist of a human subject.

This is a continuation-in-part of Ser. No. 08/036,899 filed Mar. 25, 1993 and now abandoned.

DESCRIPTION

The present invention is especially suitable for use in magnetic resonance imaging of human subjects, but it may also be used for the imaging of animals and other objects, the image or chemical composition of which is to be determined by magnetic resonance spectroscopy.

In order to obtain accurate magnetic images, it is requisite that magnetic resonance signals detected from nuclear or electron magnetic moments within the resonator that establish the RF or $B_1$ magnetic field be uniformly proportional to the spin concentration. This requirement is satisfied if the $B_1$ RF magnetic fields created by the resonator within the static $B_0$ magnetic field are homogeneous or spatially uniform over the volume of analytical interest. A contradictory requirement is the capability of conveniently placing the body mass to be imaged in the resonator, such that the $B_1$ RF field in the body mass is perpendicular to the $B_0$ field.

It is also desirable that the RF energy needed for imaging be low to minimize RF exposure of the subject. Thus, the problem of providing a uniform field and ready access of the body parts into the field also involves the confinement of the field to the area of interest so as to minimize the energy to which the body is exposed, both in terms of intensity and exposure time. A further advantage of the localized excitation provided by such a device is that problems of aliasing, i.e., image or spectroscopic wrap-around, from regions of the sample outside the region of interest are minimized.

A single-turn solenoid having a cylindrical conductor with a slit along its length has been proposed for use as a resonator in magnetic resonance spectroscopy. Such a coil is discussed in J. P. Hornak, et al., *Journal of Magnetic Resonance*, 68, 319–322 (1986), and in U.S. Pat. No. 5,139,024 to Bryant et al. As shown in FIG. 1, the resonator is constructed around a dielectric (e.g., poly(vinylchloride)) form 10 and the mass under test is placed within the cylindrical form 10. A conductive foil of metal, such as copper 12, is wrapped around the form and forms a cylinder with a gap 14 running along its length (parallel to the axis 9 of the cylinder). Capacitors 16, which may be of fixed value or varied by adjustment screw 18, are placed along the gap 14. The distribution of the capacitors and their values provide a means for tuning the uniformity or homogeneity of the RF magnetic field created within the device. RF energy may be coupled into and out of the resonator by placing a loop of wire coaxially with the cylinder above the cylinder or by connecting a transmission line across the gap (to one end thereof). The frequency of the resonator may be varied by changing the capacitance across the gap or the dimensions of the conductive elements. The equations governing the resonant frequency are given in the article by Hornak, et al., referenced above.

Other single-turn resonators are discussed in the following U.S. Pat. Nos. Froncisz, 4,446,429, May 1, 1984; Hyde, et al., 4,480,239, Oct. 30, 1984; Froncisz, et al., 4,504,788, Mar. 12, 1985. They are also mentioned and shown in articles by J. B. Kneeland, et al., *Radiology*, 1986; 160: 695–699; and *Radiology*, 1986; 158: 247–250; and W. N. Hardy, et al., *Rev. Sci. Instrum.*, 52(2), February 1981, p. 213–216. None of these resonators solve the problem of providing easy access to the body mass to be imaged, and placement within a magnetic resonance imaging system, such as, for example, the Signa magnetic resonance imaging system which is manufactured by the General Electric Company, Milwaukee, Wis., U.S.A.

The conventional mode of imaging the hand and wrist is to use a so-called surface coil, placed in the vicinity of the wrist, in conjunction with a large body coil. The large body coil provides excitation or transmission for imaging, and the surface coil is used to receive the transmitted signals after they have traveled through the mass to the imaged. This mode of imaging subjects the patient to high intensities of, or long exposure times to, RF energy. Surface coils of this type are described in U.S. Pat. Nos. 4,590,947 to Krause, 4,534,358 to Young, 4,543,959 to Sepponen, 4,724,389 to Hyde et al., 4,734,647 to Yoshimura, and European patent application 0,142,760. Alternatively, imaging of the hand and wrist has been performed by using a perforated, single-turn solenoid as described in U.S. Pat. No. 5,139,024 to Bryant. Such a design has a poor fill-factor when used to image the wrist, however.

It is, therefore, the object of the present invention to provide an improved resonator for magnetic resonance imaging of the hand and wrist, the resonator having one or more of the following features; easy access to the hand and wrist; RF magnetic field homogeneity, and tunability to control field distribution; allowing motion of the hand and wrist; concentration of the RF field so as to reduce the RF load, minimize exposure and provide for more rapid imaging than with surface coils; and ease of fabrication and sturdiness for low cost and reliability.

SUMMARY OF THE INVENTION

The resonator has a conductive structure or assembly defining an asymmetric imaging volume of sufficient size to receive and image an asymmetric body mass, such as a patient's hand and wrist. The body mass or analytical sample is contained within the resonator when the resonator is disposed within a magnetic resonance imaging system which produces a $B_0$ field. The resonator has an elongated, hollow member made of a dielectric material with first and second openings disposed transverse to a central axis. One opening has a circular shape; the other opening is oval. The resonator has a glove-like shape that readily receives a hand and wrist. The elongated resonator has its central axis disposed transverse to the $B_0$ field in order to provide a $B_1$ field in a direction transverse to the $B_0$ field of the resonator. A pair of conductive foils are disposed on the outside of the elongated hollow member. The foils are separated by two gaps that extend the axial length of each foil. The gaps provide capacitance which resonates with the inductance of the resonator.

The pair of conductive foils provide a single-turn of conductive material on the external surface of the elongated hollow member. Electromagnetic coupling to the resonator is achieved either capacitively or inductively and permits both transmitting and/or receiving the RF energy required for determining a magnetic image or a magnetic resonance spectrum.

BRIEF DESCRIPTION OF THE DRAWINGS

The foregoing, and other objects, features and advantages of the invention, as well as a presently preferred embodiment thereof, will become more apparent from a reading of the following description in connection with the accompanying drawings, in which:

FIG. 3 is an elevation view of the flattened top side of the resonator.

FIG. 4 is an end view of the circular end of the resonator.

FIG. 5 is an end view of the oval end of the resonator.

FIG. 6 is an elevation view of a curved end of the resonator.

DETAILED DESCRIPTION OF THE INVENTION

Figure 12:
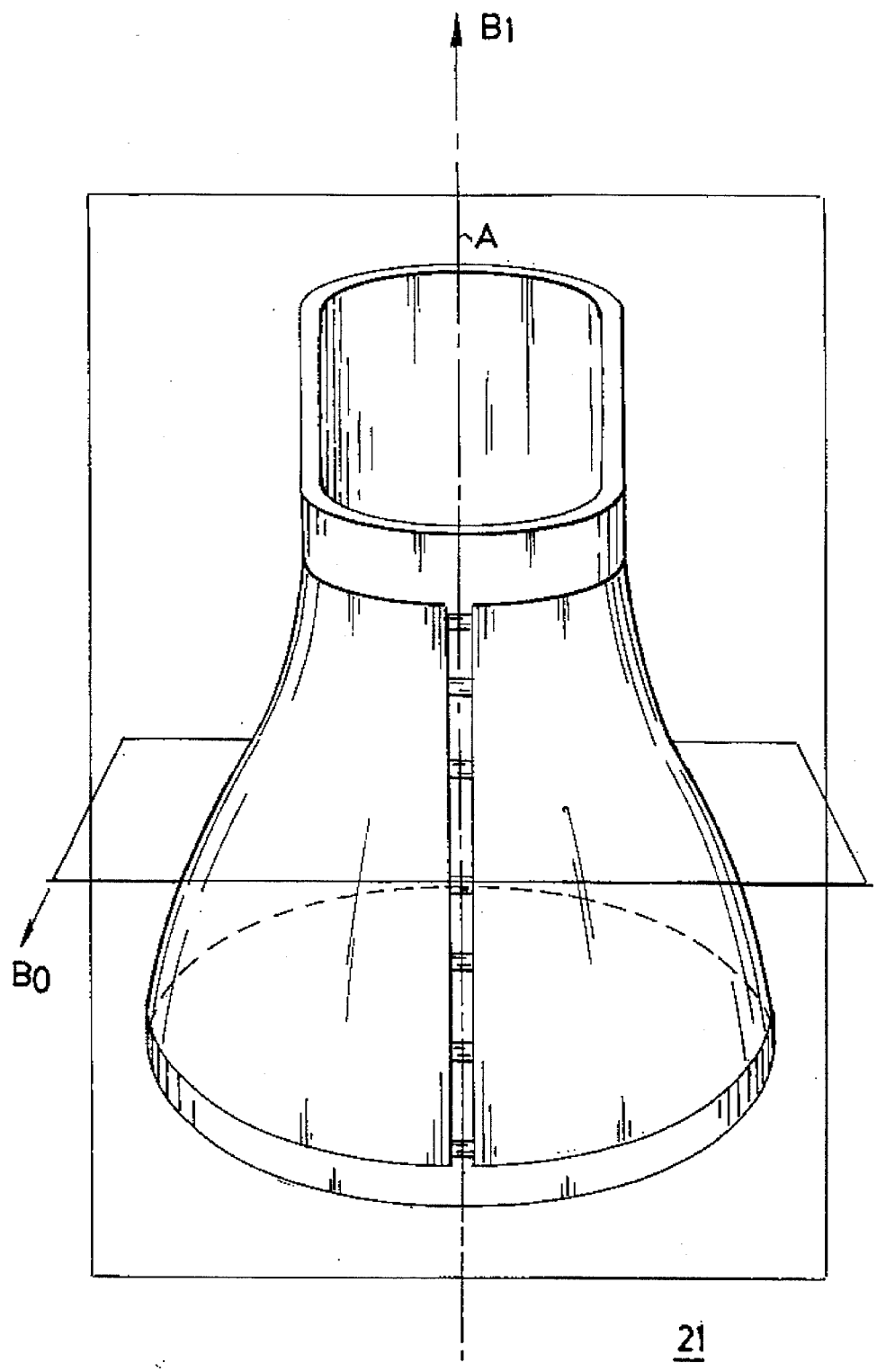
FIG. 12 is a perspective view of the resonator of FIG. 2 showing the orientation of the resonator's axis in relation to the $B_0$ field.

The resonator 21 shown in FIGS. 2–6 is an end-loading, single-turn solenoidal or loop-gap resonator which has openings 38, 39 at opposite ends of a hollow, elongate, asymmetric member 20 through which the hand and wrist of a patient is inserted into the resonator 21. Resonator 21 provides a uniform RF magnetic field by tuning its gap 24 using a series of capacitive and/or resistive elements 26 which are positioned along the gap. Protective tape 40 covers the capacitors 26. Unlike the fields produced by prior art resonators, the RF magnetic field of this resonator 21 is uniform in the region of the solenoid where the hand and wrist is placed, such that imaging without significant RF intensity decline as a function of the position of the hand and wrist in the resonator can be performed. The resonator 21 may be used both as transmitter and receiver. A loop of wire 3 around the circular end 38 couples RF energy via a cable 4 to the resonator 21. The resonator 21 has its axis A transverse to the $B_0$ field, as shown in FIG. 12 where the $B_1$ field of the resonator is also shown.

The resonator 21 is especially adapted for imaging of the hand and wrist. It is constructed of an asymmetrical member 20 of dielectric material, suitably high molecular weight, rigid poly(vinylchloride) around which outer conductive foil bands 28, 30, preferably copper, have been wrapped. The complementary foil bands 28, 30, when assembled, form the axially asymmetric resonator 21, having an imaging region 8 therein.

Openings 38, 39 have convenient anatomical shapes for receiving the wrist of a patient. In a preferred embodiment, the first opening 38 is circular in cross-section and the second opening 39 has an oval shape, through which the fingers of a patient extend when the hand and wrist are in the resonator 21. The oval opening 39 has two curved end 39a, 39b separated from each other by relatively straight portions 39c, 39d that are parallel to each other. A patient's hand and wrist are placed in the resonator 21 by sliding the end 38 of the resonator 21 over the hand like a glove.

Figure 1:
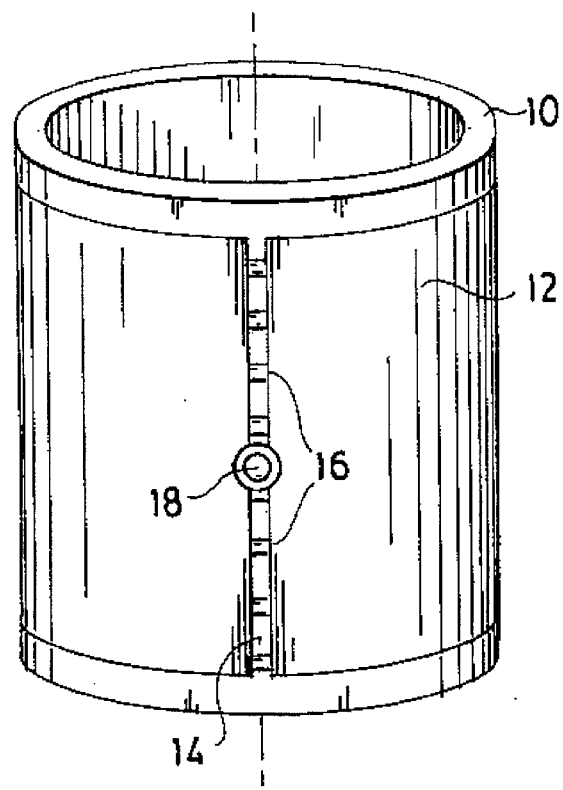
FIG. 1 is a perspective view of a single-turn solenoid loop-gap prior art resonator.

The foil bands 28, 30 are joined by capacitors 26, which may be of fixed value or variable, and are placed along the gaps 24 and 25 that separate the foil bands 28 and 30. Gaps 24 and 25 run parallel to the central axis A (FIGS. 4, 5) of the resonator 21, the axis A also being the axis of the solenoidal coil equivalent defined by the bands 28, 30. Chip capacitors 26 of equal capacitance are uniformly spaced from each other along the gaps 24 and 25 in the direction of axis A. Their spacing and value may be suitably adjusted to vary the resonant frequency (tuning) of the resonator 21 and to provide a homogeneous magnetic field in the space enclosed by foil bands 28, 30 of resonator 21. The capacitance across gaps 24, 25 between members 28, 30 can be varied by suitable mechanical means, such as an adjusting screw arrangement in order to vary or adjust the capacitance. An example of such mechanical adjustment is shown in a prior art device. See, adjusting screw 18 in FIG. 1. The chip capacitors 26 may be accompanied by resistors (not shown) to control the band width and the electrical quality factor known as Q of the solenoidal coil equivalent defined by resonator 21. The preferred embodiment of resonator 21 has two gaps 24, 25, each of which can be individually adjusted mechanically and electrically. Such separate adjustability helps maintain RF uniformity and high Q when a hand and wrist are inserted into the resonator 21, thereby reducing the effects of loading from the patient's hand and wrist.

Figure 7:
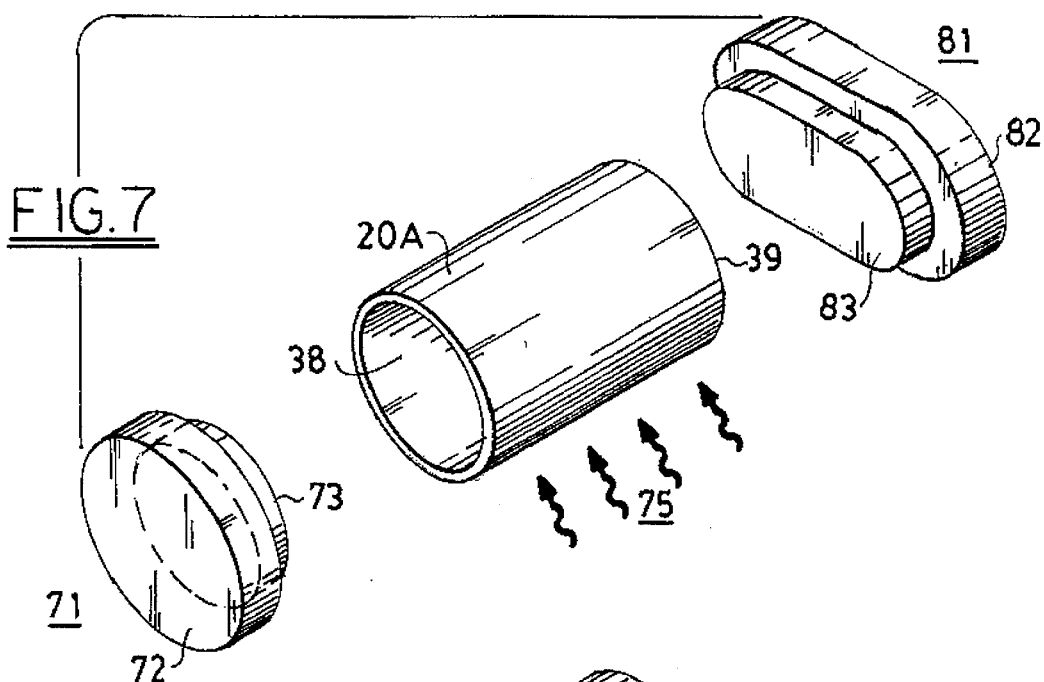
FIG. 7 is a perspective view of components and fixtures used to make the resonator.
Figure 8:
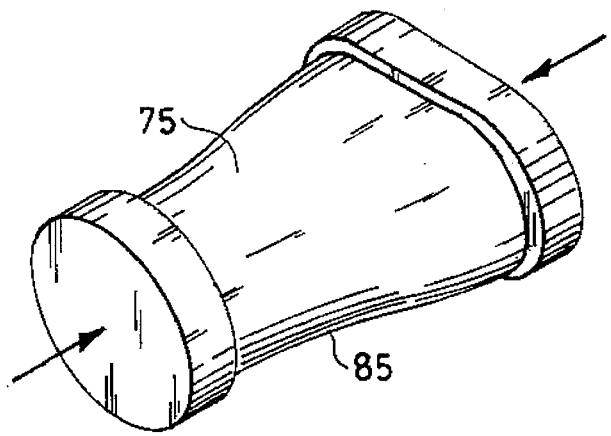
FIG. 8 is a perspective view of a resonator body mounted on its fixtures.
Figure 9:
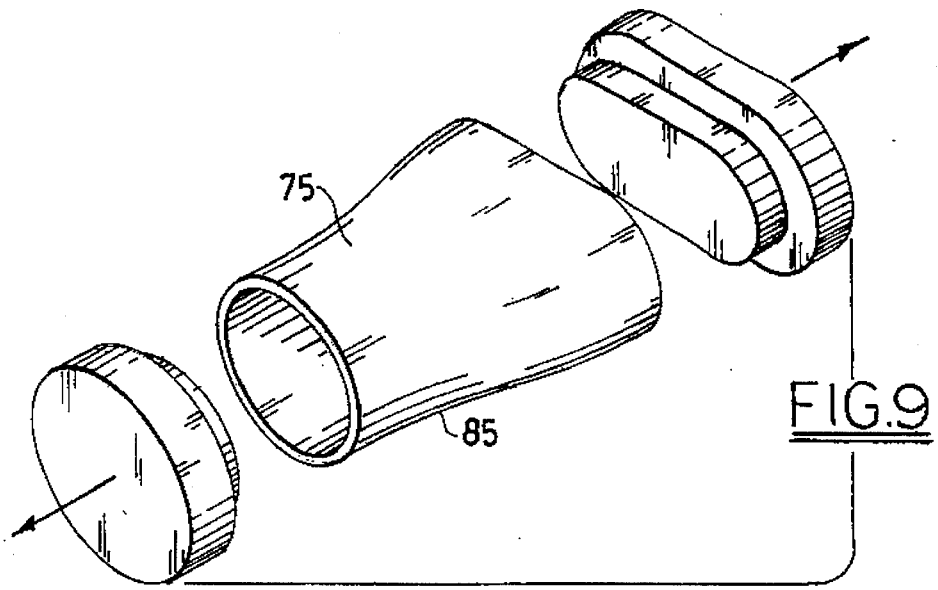
FIG. 9 is a perspective view of the fixtures removed from the resonator body.

With reference to FIGS. 7–9, there is shown a process for shaping a cylindrical body 20A into the asymmetrical body 20 used in resonator 21. Two fixtures 71, 81 are provided. Fixtures 71, 81 may be made of any suitable material, such as wood or metal, which will hold its shape when heated. Fixture 71 has an outer cylindrical pedestal 72 with an inner raised cylindrical boss 73. The circumference of circular boss 73 is approximately the same as the circumference of opening 38. Fixture 81 has an outer oval pedestal 82 with an inner raised oval boss 83. The perimeter of the oval boss 83 is the same length as the circumference of opening 39. The cylindrical body 20A is made of a heat deformable material, such as poly(vinylchloride). When heat 75 is applied to body 20A, the body 20A becomes soft and deformable. Heat is preferably applied by immersing the body 20A in boiling water.

After the body 20A is softened by heat, fixtures 71, 81 are inserted, respectively, into the openings 38, 39 of body 20A as shown in FIG. 8. The heated body 20A is pliable and is manually deformed to provide valor and dorsal sides 75, 85 and to mount the fixture 71 in end 38 and fixture 81 in end 39. Once mounted, the cylindrical body 20A is allowed to cool and retain a shape of the asymmetrical body 20 of resonator 21. After the asymmetrical body 20 cools and is rigid, the fixtures 71, 81 are removed, as shown in FIG. 9.

Figure 10:
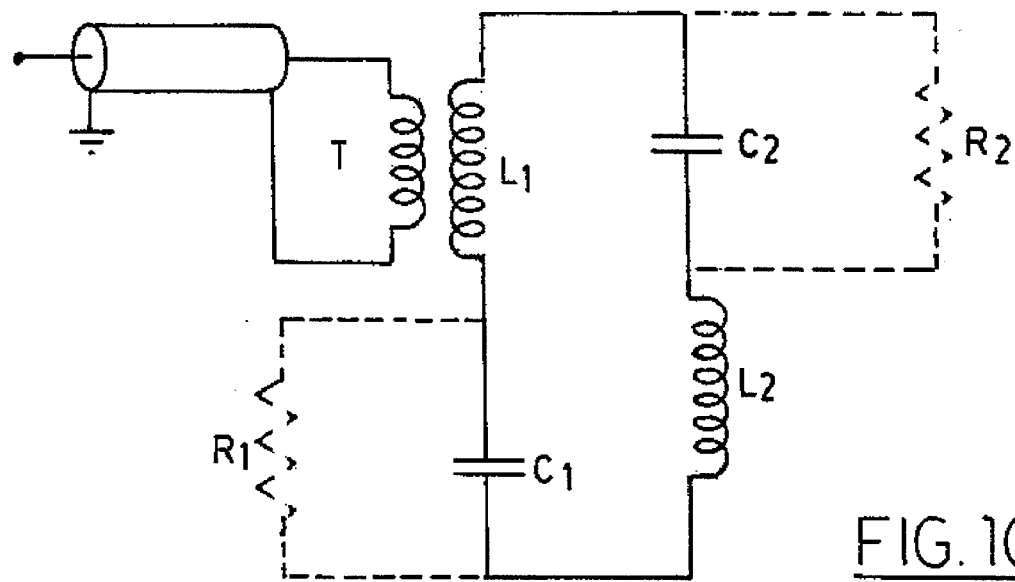
FIG. 10 is a schematic diagram of an inductive coupling circuit which may be used for coupling of RF electromagnetic energy with respect to the resonator of FIG. 2.

Referring to FIG. 10, it will be seen that the electrical circuit of the resonator 21 consists of inductors $L_1$, $L_2$, defined by the conductive foil bands 28, 30 thereof, and capacitors $C_1$, $C_2$, defined by the gaps 24, 25. The capacitors are varied to achieve frequency tuning of the resonator 21. Tuning can be broadened by adding resistive elements across the gaps as indicated schematically by $R_1$, $R_2$. RF energy is coupled into and out of the resonant circuit defined by the coil equivalent defined by resonator 21 and capacitor 26 by means of a transformer T, provided by a coupling coil 301 which may be movably positionable with respect to the resonator 21, for impedance matching purposes. The coupling coil 301 is connected through a 50 ohm coaxial line 300 to supply or receive the RF signal.

Figure 2:
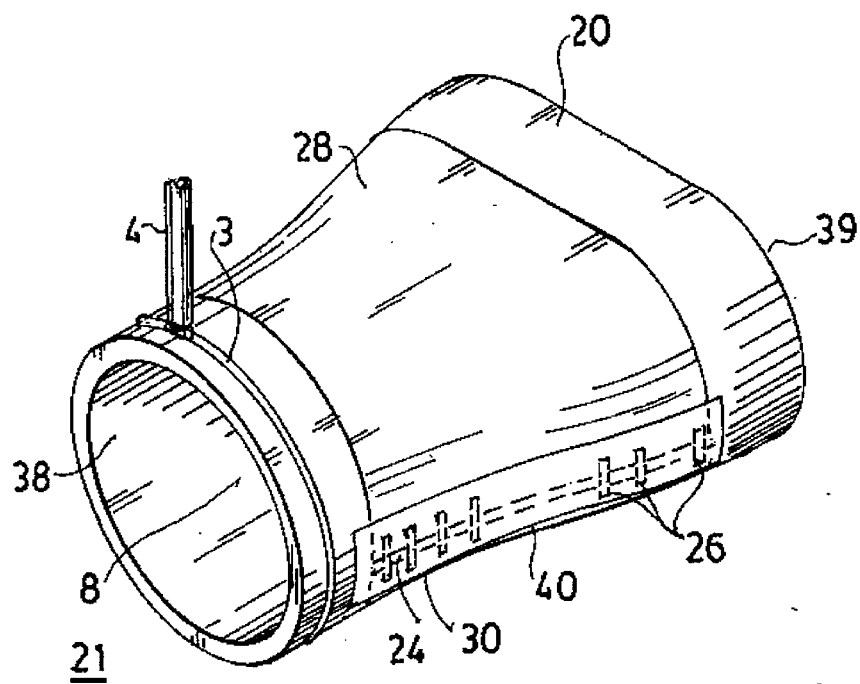
FIG. 2 is a perspective view of a resonator in accordance with an embodiment of the invention.
Figure 11:
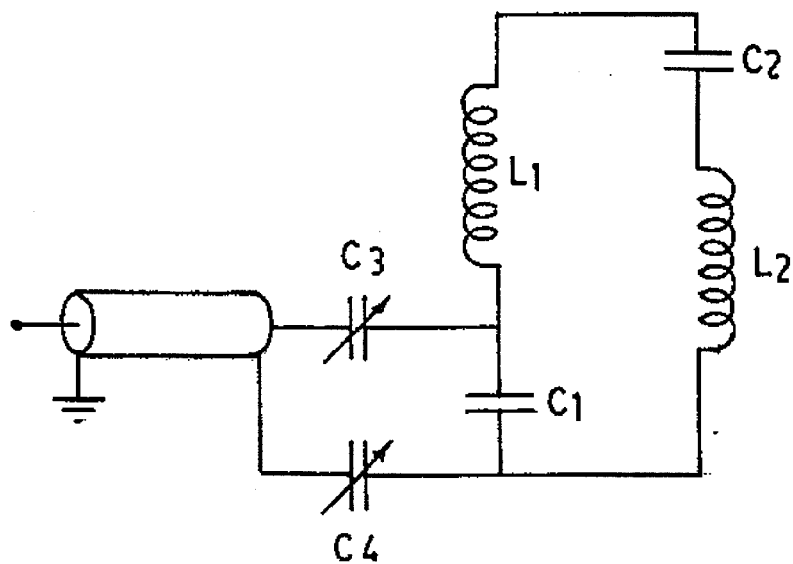
FIG. 11 is a schematic diagram of another circuit for coupling RF electromagnetic energy with respect to the resonator in FIG. 2.

Referring to FIG. 11 there is shown inductors $L_1$, $L_2$, representing the resonator 21 shown in FIG. 2, and capacitors $C_1$, $C_2$ in parallel with that inductors $L_1$, $L_2$. A 50 ohm transmission line 302 is connected through balancing capacitors $C_3$ and $C_4$. Both transmitted signals and received signals may be connected as with the circuits shown in FIG. 6 of the above referenced article by J. P. Hornak et al., which appeared in the December 1986 issue of *Radiology* 1986.

From the foregoing description it will be apparent that there has been provided improved RF resonators for magnetic resonance imaging of an asymmetric body mass, in particular a wrist and hand of a patient. While various embodiments of the invention have been described, variations and embodiments thereof within the scope of the invention, will undoubtedly suggest themselves to those skilled in the art. Accordingly the foregoing description should be taken as illustrative and not in a limiting sense.

What is claimed:

1. An MRI system fixedly tuned resonator for producing a uniform RF field in an axially asymmetric mass of tissue disposed within said resonator, said resonator comprising an elongated, hollow member having a central axis, said hollow member having a rigid inner insulated surface and an outer conductive surface, said inner insulated surface being unbroken about said axis, said outer conductive surface having a first and a second longitudinal gap extending the length of said hollow member and parallel to the central axis, said hollow member having first and second open ends disposed transverse to the central axis and an imaging region in the hollow member between the ends, each of said ends including a rigid periphery and each end having respective first and second predetermined shapes, wherein said second shape is different from said first shape, and said tissue is received through one of said ends.

2. The resonator according to claim 1, wherein said first end is circular in cross-section.

3. The resonator according to claim 1, wherein said second end is oval in cross-section.

4. The resonator according to claim 1 wherein said first end is circular in cross-section and said second end is oval in cross-section.

5. The resonator according to claim 1, wherein said outer conductive surface comprises first and second complementary conductive bands attached to the insulated surface of said hollow member to form an image region of said resonator within an interior space defined by said hollow member.

6. The resonator according to claim 5, wherein said first and second complementary bands are separated by said first longitudinal gap and said second longitudinal gap.

7. The resonator according to claim 6, wherein said first and second complementary bands are coupled to each other by a plurality of capacitors disposed in said longitudinal gaps.

8. The resonator according to claim 7, wherein said complementary bands are coupled to each other by a plurality of resistors disposed in said longitudinal gaps and in parallel with said capacitors.

9. The resonator according to claim 5, wherein said outer conductive surface is copper.

10. The resonator according to claim 1, wherein said hollow member comprises poly(vinylchloride).

11. The resonator according to claim 1 wherein said second end has an oval cross section comprising an elongated opening defined by two semicircular end portions spaced apart by an intermediate portion, comprising two parallel sections spaced from each other a distance corresponding to the diameter of the semicircular end portions.

12. An MRI system fixedly tuned resonator for producing a uniform RF field in an axially asymmetric mass of tissue disposed within said resonator, comprising: an elongate, hollow rigid member of dielectric material, said hollow rigid member having a central axis, said hollow rigid member being unbroken about said central axis, said hollow rigid member having a first opening with a circular cross-section transverse to said central axis, a second opening having an oval cross-section transverse to said central axis, wherein said tissue is received through one of said first and second openings, a layer of conductive material on the outer surface of the hollow rigid member, said layer comprising first and second complementary bands for forming an imaging region therebetween within an interior space defined by said hollow rigid member, the imaging region being of sufficient volume to contain the mass of tissue, and said first and second complementary bands being separated by first and second longitudinal gaps parallel with the central axis, the first and second complementary bands being coupled to one another by one or more capacitors.

13. The invention of claim 12 wherein said second opening is defined by two semicircular end portions spaced apart by an intermediate portion comprising two parallel sections spaced from each other a distance corresponding to the diameter of the semicircular end portions.

* * * * *